US009822935B2

(12) United States Patent
Daniels (10) Patent No.: US 9,822,935 B2
(45) Date of Patent: Nov. 21, 2017

(54) LIGHT SOURCE ARRANGEMENT HAVING A PLURALITY OF SEMICONDUCTOR LASER LIGHT SOURCES

(71) Applicant: OSRAM GmbH, Munich (DE)

(72) Inventor: Martin Daniels, Berlin (DE)

(73) Assignee: OSRAM GmbH, Munich (DE)

( * ) Notice: Subject to any disclaimer, the term of this patent is extended or adjusted under 35 U.S.C. 154(b) by 150 days.

(21) Appl. No.: 14/662,298

(22) Filed: Mar. 19, 2015

(65) Prior Publication Data
US 2015/0267878 A1 Sep. 24, 2015

(30) Foreign Application Priority Data

Mar. 24, 2014 (DE) .................. 10 2014 205 452

(51) Int. Cl.
| | |
|---|---|
| *F21V 7/04* | (2006.01) |
| *G01S 1/00* | (2006.01) |
| *G09B 9/00* | (2006.01) |
| *H01S 3/00* | (2006.01) |
| *H01S 3/30* | (2006.01) |
| *F21K 99/00* | (2016.01) |
| *H01S 5/40* | (2006.01) |
| *F21W 101/10* | (2006.01) |
| *F21W 131/20* | (2006.01) |
| *F21W 131/406* | (2006.01) |
| *H01S 5/00* | (2006.01) |
| *F21Y 115/30* | (2016.01) |
| *F21Y 115/10* | (2016.01) |

(52) U.S. Cl.
CPC .............. *F21K 9/52* (2013.01); *H01S 5/4012* (2013.01); *F21W 2101/10* (2013.01); *F21W 2131/20* (2013.01); *F21W 2131/406* (2013.01); *F21Y 2115/10* (2016.08); *F21Y 2115/30* (2016.08); *H01S 5/005* (2013.01); *H01S 5/0071* (2013.01)

(58) Field of Classification Search
CPC .... F21K 9/52; F21Y 2115/30; F21Y 2115/10; H01S 5/4012; H01S 5/005; H01S 5/0071; F21W 2101/10; F21W 2131/20; F21W 2131/406
USPC ............................................. 362/553; 353/99
See application file for complete search history.

(56) References Cited

U.S. PATENT DOCUMENTS

| | | | | |
|---|---|---|---|---|
| 3,942,127 A | * | 3/1976 | Fluhr | .................. H01S 3/08081 359/347 |
| 6,356,577 B1 | | 3/2002 | Miller | |

(Continued)

*Primary Examiner* — Elmito Breval
*Assistant Examiner* — Jessica M Apenteng
(74) *Attorney, Agent, or Firm* — Viering, Jentschura & Partner mbB (57) ABSTRACT

A light source arrangement is provided. The light source arrangement may include a plurality of semiconductor laser light sources arranged in such a way that the laser light emitted by the semiconductor laser light sources is aligned in parallel, and a deflection unit configured to collect and influence all beam paths of the laser light emitted by the semiconductor laser light sources so as to form a beam. The deflection unit has a first mirror element with a concavely curved surface, which is embodied to capture and reflect the laser light emitted by the semiconductor laser light sources by the surface. The light source arrangement may further include a second mirror element with a convexly curved surface, which is embodied to capture and focus the laser light reflected by the first mirror element.

9 Claims, 8 Drawing Sheets

(56) References Cited

U.S. PATENT DOCUMENTS

| | | | |
|---|---|---|---|
| 7,396,136 B2 * | 7/2008 | Kim | F21V 7/0091 348/801 |
| 2004/0252744 A1 * | 12/2004 | Anikitchev | G02B 27/0977 372/100 |
| 2013/0321777 A1 * | 12/2013 | Wang | F21V 13/08 353/31 |
| 2014/0022512 A1 * | 1/2014 | Li | F21V 9/00 353/31 |

* cited by examiner

LIGHT SOURCE ARRANGEMENT HAVING A PLURALITY OF SEMICONDUCTOR LASER LIGHT SOURCES

CROSS-REFERENCE TO RELATED APPLICATION

This application claims priority to German Patent Application Serial No. 10 2014 205 452.4, which was filed Mar. 24, 2014, and is incorporated herein by reference in its entirety.

TECHNICAL FIELD

Various embodiments relate generally to a light source arrangement including a plurality of semiconductor laser light sources arranged in such a way that the laser light emitted by the semiconductor laser light sources is aligned in parallel, and including a deflection unit for collecting and influencing all beam paths of the laser light emitted by the semiconductor laser light sources so as to form a beam. Moreover, various embodiments relate generally to a headlight/spotlight including a housing having a light exit opening and a light source arrangement arranged in the housing.

BACKGROUND

Light source arrangements of the generic type serve as illumination means for headlights/spotlights, which must provide high light powers for very different illumination purposes. By way of example, headlights/spotlights of the generic type are e.g. vehicle headlamps, illumination apparatuses for data and video projectors, digital cinema film projectors, effect spotlights in the entertainment industry and illumination apparatuses for technical, industrial and medical applications, and for the illumination of space, in particular for the illumination of outdoor space, as are used for example in floodlight installations in stadia, and/or the like. The required luminosities require either very high-volume light sources or else they require a multiplicity of small power light sources, e.g. semiconductor light sources, as are provided by light-emitting diodes or semiconductor laser diodes. However, in order to be able to achieve the required light power, it is necessary to bring together the multiplicity of semiconductor laser light sources.

Previous concepts provide for each semiconductor laser light source to have a dedicated focusing lens and a dedicated deflection mirror, by which, by way of further diffraction optics, which, in particular, have a large lens for all rays of the laser light, is required. The underlying principle is based on the fact that the laser light is guided to a conversion material which interacts with the laser light and, as a result of this, provides light with a desired, predetermined spectral distribution. A phosphor or one or more phosphor mixtures are often used as conversion material. As a result of the high energy and power density of the laser light, the conversion material can generate a high light power of high luminance with a desired spectral distribution. Such applications are also referred to as laser activated remote phosphor applications (LARP applications).

Available semiconductor laser light sources in the form of semiconductor laser diodes are currently available with a power of a few watts. In the case of an overall required optical power of 100 W or more, correspondingly many semiconductor laser diodes should therefore be switched together and operated together, wherein the generated rays of laser light thereof need to be combined by a suitable deflection unit. In order to generate a suitable beam quality of the generated laser light, the semiconductor laser light source can have primary optics, for example in the form of a lens.

As a result of the comparatively large number of individual semiconductor laser light sources providing the laser light, an installation size emerges for the light source arrangement in the prior art which is decisively determined by the number and the arrangement of the semiconductor laser light sources and the deflection unit. The system integration proves to be ever more complicated if a high light power is desired.

Light source arrangements of this generic type are e.g. previously known from U.S. Pat. No. 6,356,577. Here, a plurality of semiconductor laser light source arrangements, arranged line-by-line, are arranged with a deflection unit in such a way that the laser light rays provided by the semiconductor laser light arrangements are diffracted to form a common beam. For this purpose, the deflection unit is provided; it is formed by a number of mirrors which are connected to one another in the line direction and it deflects the laser light rays, which are provided by the semiconductor laser light source arrangements and likewise arranged line-by-line, to form a common beam.

The use of such deflection units, which have a dedicated mirror for each individual ray of emitted laser light, was found to be complicated in terms of construction and requires much installation space. Moreover, comparatively long beam paths are required in the deflection unit, which is in conflict with a reduction in the installation size. Finally, the arrangement of line-shaped semiconductor laser light source arrangements vis-à-vis the deflection unit requires increased outlay. This structure is inexpedient for producing modern, compact headlights/spotlights and projectors, in particular for mobile use.

SUMMARY

A light source arrangement is provided. The light source arrangement may include a plurality of semiconductor laser light sources arranged in such a way that the laser light emitted by the semiconductor laser light sources is aligned in parallel, and a deflection unit configured to collect and influence all beam paths of the laser light emitted by the semiconductor laser light sources so as to form a beam. The deflection unit has a first mirror element with a concavely curved surface, which is embodied to capture and reflect the laser light emitted by the semiconductor laser light sources by the surface. The light source arrangement may further include a second mirror element with a convexly curved surface, which is embodied to capture and focus the laser light reflected by the first mirror element.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments may improve the generation of the beam in a generic light source arrangement. Accordingly, an improved headlight/spotlight may be provided.

As a solution, various embodiments provide a light source arrangement in accordance with independent claim 1. Furthermore, various embodiments provide a headlight/spotlight in accordance with further independent claim 10. Further advantageous embodiments emerge from the features of the dependent claims.

In various embodiments, in a light source arrangement of the generic type, various embodiments provide for the deflection unit to have a first mirror element with a concavely curved surface, which is embodied to capture and reflect the laser light emitted by the semiconductor laser light sources by the surface, and a second mirror element with a convexly curved surface, which is embodied to capture and focus the laser light reflected by the first mirror element.

On the part of the headlight/spotlight, what is suggested is that, for example, the light source arrangement is embodied in accordance with various embodiments.

What various embodiments may achieve is that path lengths of the rays of laser light emitted by the semiconductor laser light sources, having substantially the same length or at least merely having small deviations from each other can be realized. Deviations may possibly occur to the extent that the curvature of the mirror elements influences the path lengths. Moreover, what various embodiments may achieve is that the beam path of the beam is significantly shortened due to the double reflection on account of the first and the second mirror element such that a significantly higher degree of compactness can be achieved which, overall, permits a reduction in the installation volume of the light source arrangement. Moreover, what various embodiments may achieve is that angular errors and tolerances are substantially less critical than conventionally due to the comparatively short path lengths. Large and expensive output lenses with the connected disadvantages can be largely avoided as a result of this. Various embodiments may achieve this by virtue of the beam path being folded due to the two-time reflection at the first and at the second mirror element.

The deflection unit can be a separate component. However, it can also be combined with the semiconductor laser light sources to form a common unit. It was found to be advantageous if the semiconductor laser light sources and the second mirror element form a common assembly. The arrangement according to various embodiments moreover renders it possible to realize a largely compact setup, even in the case of a large number of semiconductor laser light sources.

The semiconductor laser light sources are e.g. embodied to generate laser light with substantially the same wavelength. Moreover, provision may of course be made for semiconductor laser light sources generating laser light with different wavelengths to be combined with one another. This may be varied depending on the desired application.

The first mirror element has the concavely curved surface, which is aligned in the direction of the semiconductor laser light sources. The laser light emitted by the semiconductor laser light sources is incident on the concave surface and reflected in the direction of a focus of the concave curvature of the surface of the first mirror element. By way of example, the concave curvature can be a spherical curvature, a parabolic curvature, a hyperbolic curvature, combinations thereof or the like.

The laser light reflected by the first mirror element is thereupon incident on the convexly curved surface of the second mirror element. Like in the case of the first mirror element, the convex curvature may have a spherical, parabolic, hyperbolic and/or the like embodiment. It may be embodied in a manner adapted to the curvature of the surface of the first mirror element such that the rays of laser light reflected from the surface of the second mirror element are focused onto a region or point. This region or point can either be arranged in front of the surface of the first mirror element, or else therebehind. Moreover, it is also possible for the region to be arranged laterally next to the first mirror element. In various embodiments, the curvatures of the first and the second mirror element are matched to one another in such a way that the laser light is focused onto a region, e.g. substantially onto a point.

The surfaces may be provided by correspondingly formed solid bodies, e.g. by ceramic solid bodies which are provided with suitable mirroring, e.g. a corresponding metallization, for example a silver layer, a gold layer, alloys thereof and/or the like. In various embodiments, the surfaces are embodied in a manner matched to a reflection of the laser light that is as low-loss as possible. It was found to be advantageous if optical axes of the first and the second mirror element are aligned coaxially with respect to one another. As a result, it is possible to obtain a particularly expedient guide of the laser light.

Various embodiments may permit a diameter of the first mirror element across the beam paths of the laser light emitted by the semiconductor laser light sources to be much larger than a corresponding diameter of the second mirror element. As a result, it is possible to achieve not only a very compact and effective structure for capturing all beam paths of the laser light emitted by the semiconductor light sources, but at the same time, as a result of the folded reflection principle, to achieve a significant shortening of the beam path in order to be able to achieve the function of the light source arrangement as intended.

It was found to be possibly advantageous if the curvatures and the distance between the surfaces of the first and the second mirror element are embodied in such a way that a focus of the concavely curved surface coincides with a virtual focus of the convexly curved surface. The virtual focus of the convexly curved surface lies on the rear side in relation to the surface of the second mirror element. In actual fact, this focus is not reached by the beam paths of the laser light due to the reflection at the surface of the second mirror element.

What is furthermore proposed is that the first mirror element has a passage opening. As a result, it is possible for the laser light to be decoupled on the rear side of the first mirror element and, in this manner, for a symmetric beam path to be generated. Since a cross-sectional surface of the second mirror element across the beam path of the laser light may be very small and since there is further focusing by the reflection at the surface of the second mirror element, the opening in the first mirror element can be very small. The function of reflecting the rays of laser light emitted by the semiconductor laser light sources at the surface of the first mirror element is not impeded thereby. This is moreover indebted to the circumstances that, in this embodiment, the second mirror element can be arranged coaxially in relation to the first mirror element. Since the diameter thereof is larger than the diameter of the passage opening due to the aforementioned focusing property, rays of laser light emitted by the semiconductor laser light sources cannot be directly incident in the region of the passage opening in any case.

Furthermore, the semiconductor laser light sources may be arranged in such a way that they substantially do not emit the light thereof in the region of the second mirror element. What this may achieve is that substantially all of the emitted laser light from all semiconductor laser light sources can be captured by the first mirror element. The small dimensions of the second mirror element allow it substantially not to adversely affect the arrangement of the semiconductor laser light sources.

Various embodiments may provide for an optical waveguide to be arranged in the passage opening, said optical waveguide extending beyond the first mirror element, e.g. on the rear side in relation to the concavely curved surface of the first mirror element. The optical waveguide may render it possible to capture the laser light focused by the deflection unit of the invention and to guide said light to a desired point. As a result of this, the setup of the light source arrangement can be made more compact. Here, it was furthermore found to be advantageous if the optical waveguide fills the passage opening and projects beyond the rear side of the first mirror element. Naturally, the passage opening may also be embodied in a manner adapted to available cross sections of optical waveguides. The optical waveguide may fill the complete cross section of the passage opening such that good coupling with, where possible, all of the laser light can be realized. Using the optical waveguide, the laser light may be guided to further diffraction apparatuses, which should be apportioned to the light source arrangement, in order to use the laser light as desired.

In various embodiments, provision may be made for the optical waveguide to be used to guide the laser light to a conversion layer, in which the laser light is converted into light with the desired spectral distribution. In various embodiments, the conversion layer is embodied in such a way that white light is generated. The conversion layer may also be embodied in such a way that it has regions with different effectiveness in relation to the laser light such that the regions generate light with different spectral distribution, which then may provide white light when they are all superposed. By way of example, the optical waveguide may be a glass-based optical waveguide. However, it may also be a plastic-based optical waveguide. The optical waveguide may also be embodied as a hollow conductor, for example with side surfaces that are embodied as a metallic or dielectric mirror. In various embodiments, the optical waveguide may be embodied in a manner adapted to the wavelength of the laser light such that said optical waveguide may guide the laser light in a largely lossless manner, even in the case of inexpedient radii of curvature. As a result, a high efficiency of the light source arrangement overall may be achieved.

It was found to be possibly advantageous if the second mirror element is embodied to focus the laser light reflected from the surface thereof into the passage opening. As a result, the passage opening may be realized with small dimensions in respect of the cross section thereof.

Moreover, provision may be made for the optical waveguide to project beyond the concavely curved surface of the first mirror element in the direction of the second mirror element and for the second mirror element to be embodied to focus the laser light reflected from the surface thereof onto a coupling surface of the optical waveguide. The passage opening may ly on an axis of the coaxial arrangement of the first and the second mirror element. This embodiment may render it possible to compensate for deviations in respect of the focusing of the deflection unit.

Furthermore, what is proposed is that a cross-sectional area of the passage opening is embodied in a manner matched to an arrangement of the semiconductor laser light sources. By way of example, if the arrangement of the semiconductor laser light sources is rectangular, the passage opening may likewise be embodied in a corresponding rectangular manner and with a corresponding alignment. In principle, this also applies to the first and the second mirror element, which may be embodied in accordance with the arrangement of the semiconductor laser light sources. This embodiment was found to be possibly advantageous if a multiplicity of semiconductor laser light sources are arranged e.g. in a plane across the beam paths of the laser light emitted by the semiconductor laser light sources.

In accordance with a further aspect of various embodiments, what is proposed is that the deflection unit has a lens in the beam path between the semiconductor laser light sources and the first mirror element, said lens e.g. having an integral embodiment with the second mirror element. The lens may achieve an additional focusing effect, by which the beam path overall can be shortened even more. It was found to be possibly advantageous if this lens is embodied together with the second mirror element as a catadioptric system. As a result, the installation size of the light source arrangement may be further reduced.

Finally, in accordance with various embodiments, what is proposed is that a distance between the semiconductor laser light sources and the concavely curved surface of the first mirror element is less than a distance between the convexly curved surface of the second mirror element and the concavely curved surface of the first mirror element. As a result of this embodiment, the beam path overall may be shortened even more such that even a large number of poorly focusing semiconductor laser light sources may reliably be used for generating the beam.

Figure 1:
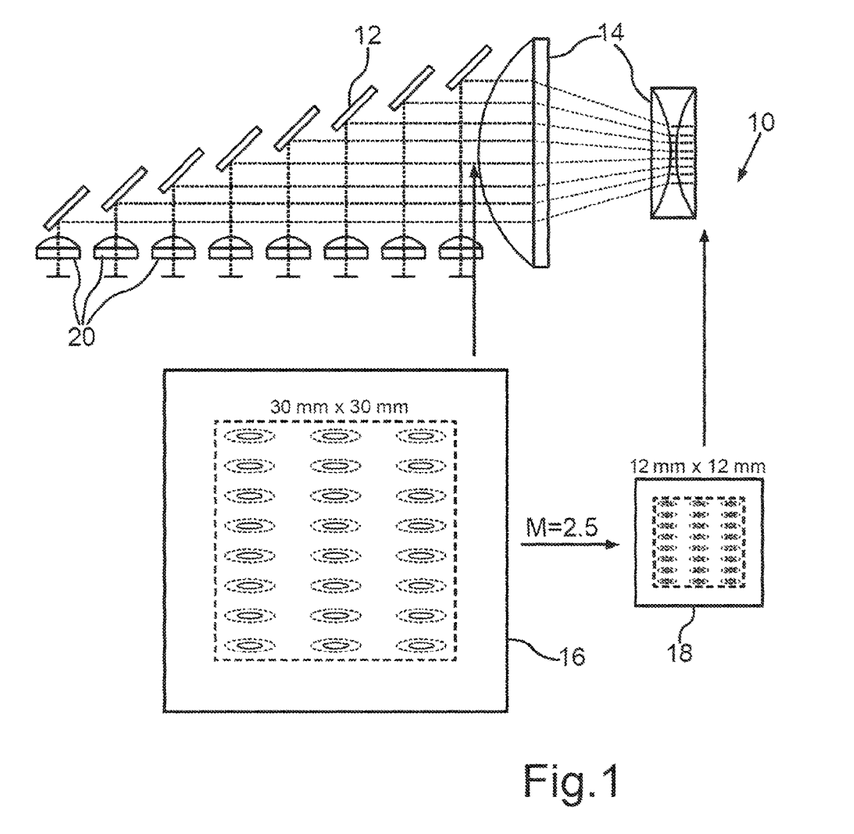
FIG. 1 schematically shows a conventional light source arrangement, including a stepped mirror and a lens arrangement for generating a beam.

FIG. 1 shows a schematic perspective sectional view of a conventional light source arrangement 10, including a semiconductor laser light source arrangement 16, which in the present case has 24 semiconductor laser light sources 20 arranged in three columns (reference sign 16). The semiconductor laser light sources 20 emit laser light which is aligned mutually in parallel. The light source arrangement 10 furthermore may include a deflection unit (not provided with a reference sign) including a stepped mirror 12 and a lens arrangement 14. The stepped mirror 12 makes a separate mirror available to each individual beam path of laser light emitted by the semiconductor laser light sources 20 such that all beam paths of the laser light emitted by the semiconductor laser light sources 20 are collected and influenced so as to form a beam. Therefore, the deflection unit in accordance with FIG. 1 serves to concentrate the light rays into the beam. In the embodiment in accordance with FIG. 1, the semiconductor laser light source arrangement 16 has dimensions of 30 mm×30 mm in respect of the light outlet cross section. Moreover, it is alternatively possible to replace the semiconductor laser light source arrangement 16 by a smaller semiconductor laser light source arrangement 18 with dimensions of 12 mm×12 mm, wherein, in that case, the deflection unit with the stepped mirror 12 and the lens arrangement 14 is naturally to be adapted accordingly.

Figure 2:
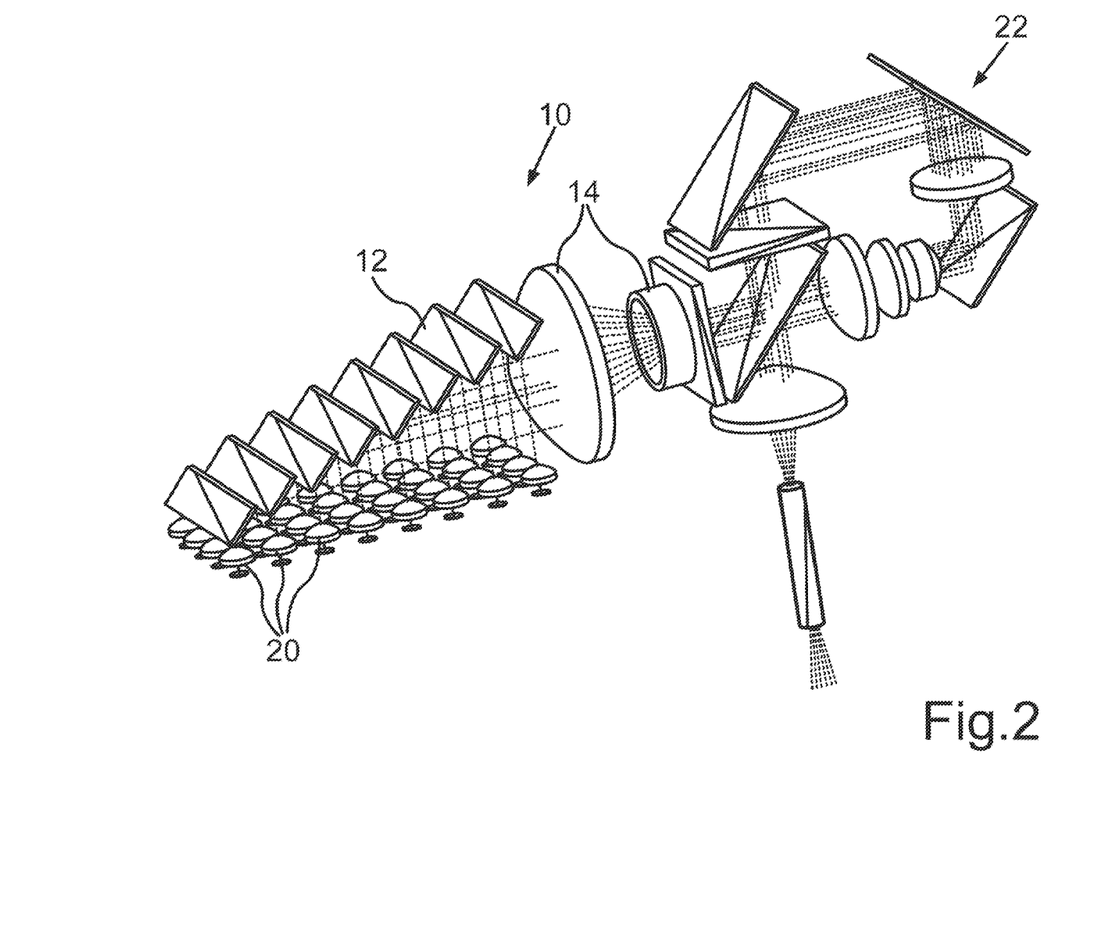
FIG. 2 shows a schematic perspective view of a further embodiment of the light source arrangement in accordance with FIG. 1.

FIG. 2 shows a section of a headlight/spotlight (not provided with a reference sign) for a beam path with a light source arrangement 10 consisting of a matrix arrangement of 4×8 laser diodes and a further light processing unit 22 serving to guide the focused laser light to a conversion unit such that white light is provided for illumination purposes. This is elucidated schematically on the basis of FIG. 3; there, however, in a 4×12 arrangement.

Figure 3:
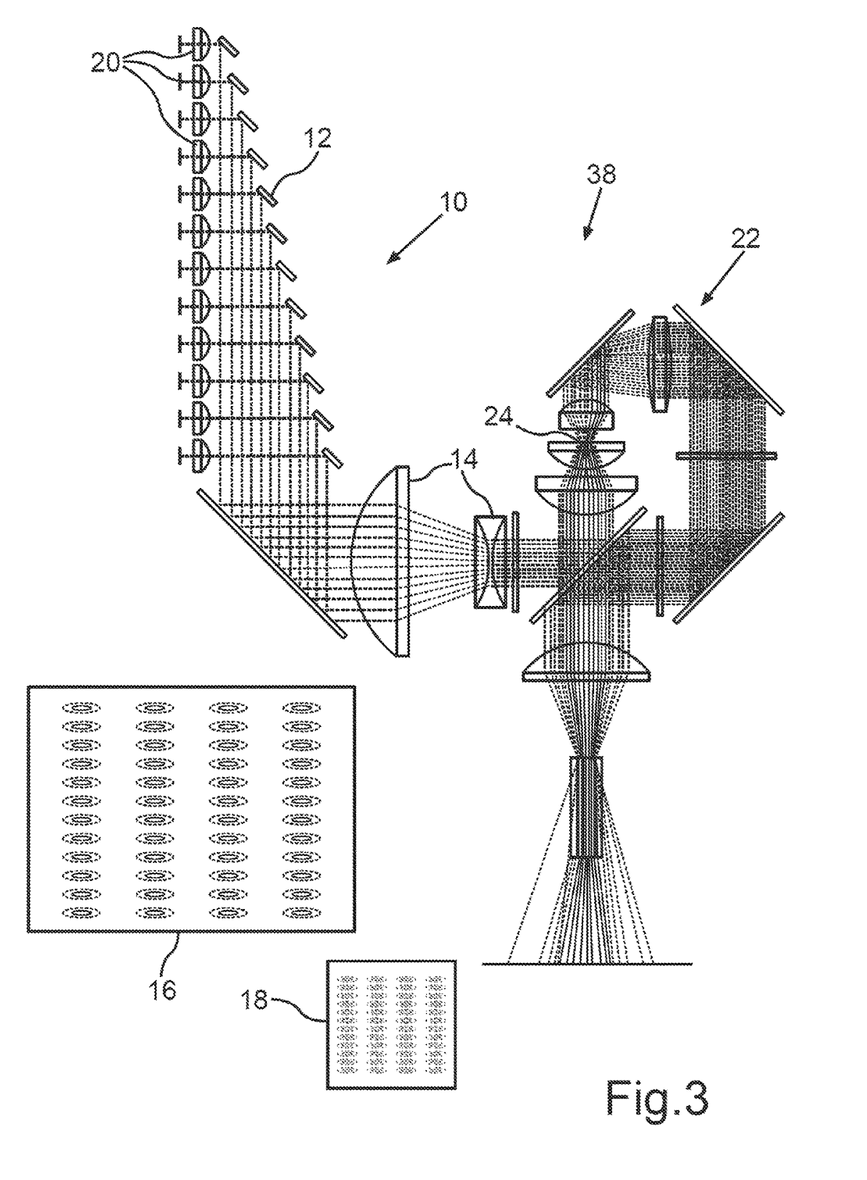
FIG. 3 shows a schematic perspective view of a headlight/spotlight including a light source arrangement in accordance with FIG. 1.

For the purposes of generating white light from the monochromatic laser light from the semiconductor laser light sources 20, in this case blue light with a wavelength of 450 nm, provision is made for a conversion unit 24, which has a rotating disk by which the desired color composition of the light can be achieved. In the present case, this is a rotating disk, which is also referred to as rotating phosphor wheel, which has conversion substances for different colors arranged in succession in the circumferential direction and therefore irradiated by the laser light in a sequential sequence, i.e. in series in time. The rotational speed of the conversion disk is adapted in such a way that, for the human eye, a superposed color effect toward white light is generated.

As a result of the arrangement and embodiment of the deflection unit of the light source arrangement 10, the latter is only suitable to a restricted extent for reducing dimensions, e.g. if the number of semiconductor laser light sources 20 is to be increased so as to generate a higher radiation power, especially since the beam paths require corresponding dimensions.

Figure 4:
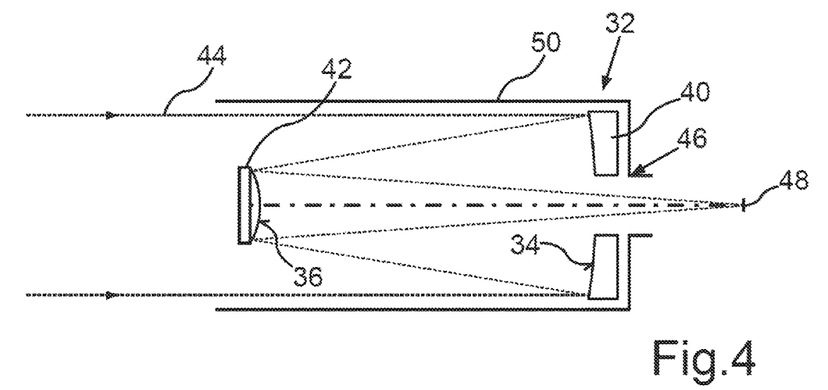
FIG. 4 shows a schematic sectional illustration of a deflection unit for a light source arrangement according to various embodiments.

FIG. 4 shows a deflection unit 32 in accordance with various embodiments which has a first mirror element 40 with a concavely curved surface 34 embodied to capture and reflect the parallel laser light emitted by the semiconductor laser light sources 20 by the surface 34.

Figure 5:
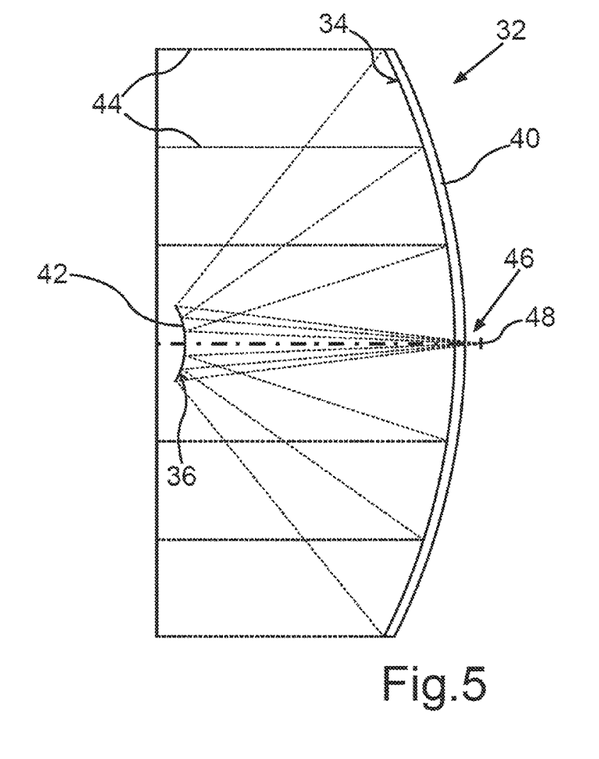
FIG. 5 shows a more concrete sectional illustration of the deflection unit on the basis of the principle in accordance with FIG. 4.
Figure 6:
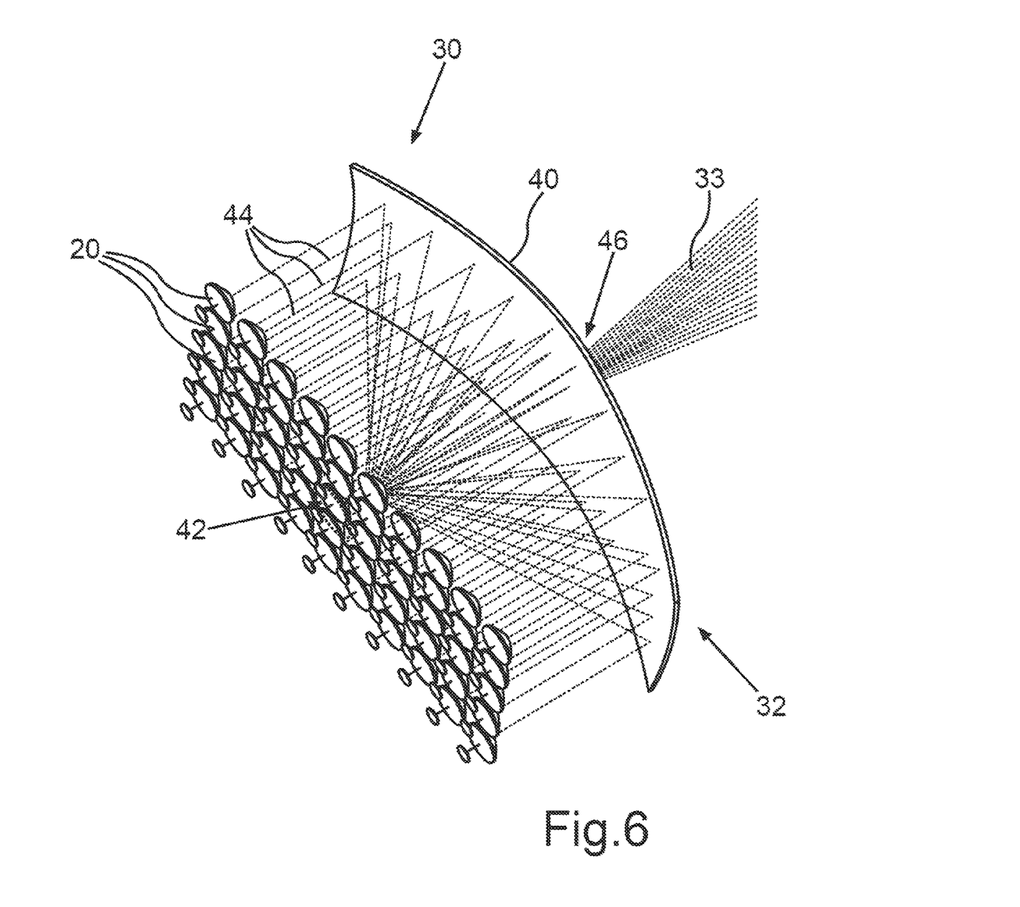
FIG. 6 shows a perspective schematic view of a light source arrangement including a deflection unit in accordance with FIG. 5.

The deflection unit 32 serves to collect and influence all beam paths 44 of the laser light emitted by the semiconductor laser light sources 20 in order to form a beam and furthermore includes a second mirror element 42 with a convexly curved surface 36 embodied to capture and focus the laser light reflected by the first mirror element 40. In the present case, the first and the second mirror element 40, 42 are arranged coaxially to one another in relation to a respective optical axis. The mirror element 40 has a passage opening 46 in the region of the axis of the coaxial arrangement. The laser light reflected by the second mirror element 42 is focused on a focusing point 48 lying behind the first mirror element 40. FIG. 5 elucidates an overall beam path of beam paths of the laser light emitted by the semiconductor laser light sources 20 in the deflection unit 32. FIG. 6 shows a corresponding perspective arrangement with a matrix-like semiconductor laser light source arrangement of the semiconductor laser light sources 20. It is clear from FIG. 6 that good focusing in the case of small dimensions can be achieved, even in the case of a large number of semiconductor laser light sources 20 e.g. arranged within a plane.

Using the deflection unit, in particular the deflection unit 32 of various embodiments, the beam may be prepared for smaller subsequent optical apparatuses.

By comparing various embodiments corresponding to FIG. 5 and FIG. 6 with the prior art as per FIG. 1 to FIG. 3, it is immediately clear that the beam lengths of the individual respective beam paths 44 are significantly shorter in the various embodiments. Additionally, angular errors and tolerances have a smaller effect in the various embodiments since long beam paths result in greater effects in this regard. Consequently, a lower mean thickness and a lower weight of the light source arrangement 30 are achievable by various embodiments.

In order to achieve its advantage, the various embodiments may use, inter alia, the effect of folding the beam path, which may result in a substantial reduction in the installation size (compare FIG. 4 to FIG. 6). The laser light incident in parallel is focused by the concave mirror element 40, which in this case has a parabolic form, onto the focusing point 48 via the second mirror element 42, which has a convex hyperbolic form in this case. In this embodiment, the focusing point 48 lies outside of the deflection unit 32. The focusing point can also lie within the deflection unit 32, e.g. in the case of the application in LARP applications, since a subsequent optical system is required in these applications. Alternatively, both the primary mirror and the secondary mirror may have free-form embodiments.

A further effect of the light source arrangement 30 according to various embodiments may emerge to the effect that, in the case of specific embodiments of the two mirror elements 40, 42, a very good imaging quality can be achieved and the latter is substantially only dependent on the divergence of the beam paths 44 of the incident laser light and on the quality of the mirrors or the setting.

With regard to LARP applications, new possibilities emerge with the invention for significantly increasing the number of semiconductor laser light sources 20 and nevertheless still obtaining an acceptable system size. As a result of the good imaging properties of the mirror optics of the deflection unit 32, different beam shaping principles are conceivable for the further optical system. Here, the semiconductor laser light sources 20 may be arranged around the second mirror element 42 in almost any geometric arrangement, for example in the form of a grid or the like.

In the embodiment in accordance with FIG. 6, provision may be made for the second mirror element 42 to be further away than the semiconductor laser light sources 20 from the point of view of the first mirror element 40, i.e. disposed behind the semiconductor laser light sources 20 from the point of view of the first mirror element 42. The passage opening in the mirror element 40 has not been depicted in FIG. 6 for reasons of clarity. Alternatively, the passage area can also be embodied as an area segment, embodied in a transmissive manner, in the center of the first mirror element 40.

Figure 7:
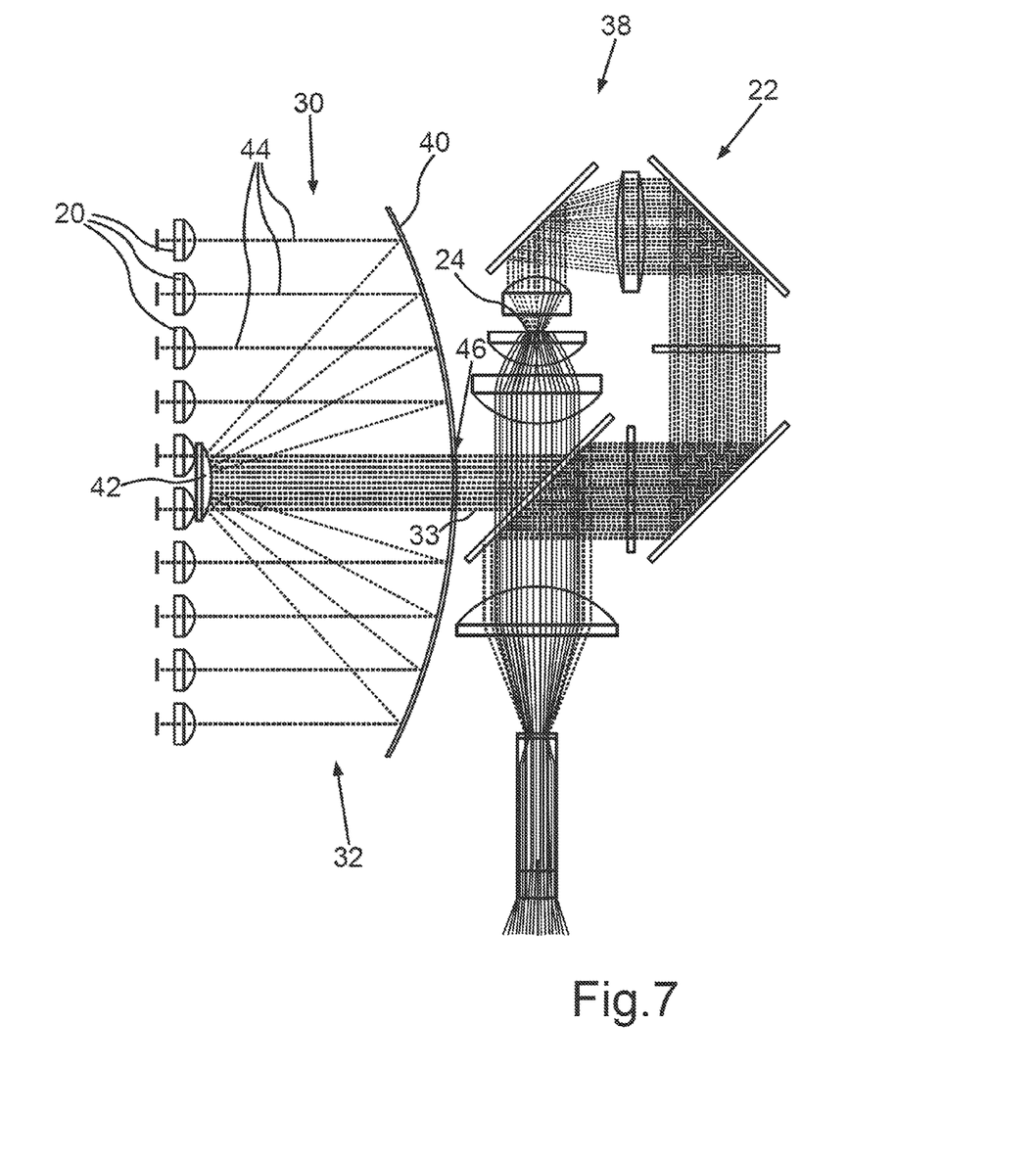
FIG. 7 shows a schematic functional setup of a headlight/spotlight including a light source arrangement in accordance with FIG. 6.

FIG. 7 shows a headlight/spotlight 38 in a basic beam guiding view, which has a light source arrangement 30 on the basis of that from FIG. 6. However, in contrast to FIG. 6, the second mirror element 42 in this case is arranged at a shorter distance from the first mirror element 40 than the semiconductor laser light sources 20. FIG. 7 shows the further optical processing by the optical system 22, as was already explained on the basis of FIG. 3. Here, the reflecting surface of the second mirror element 42 is embodied in such a way that the laser rays 33 are combined to form a parallel beam.

Figure 8:
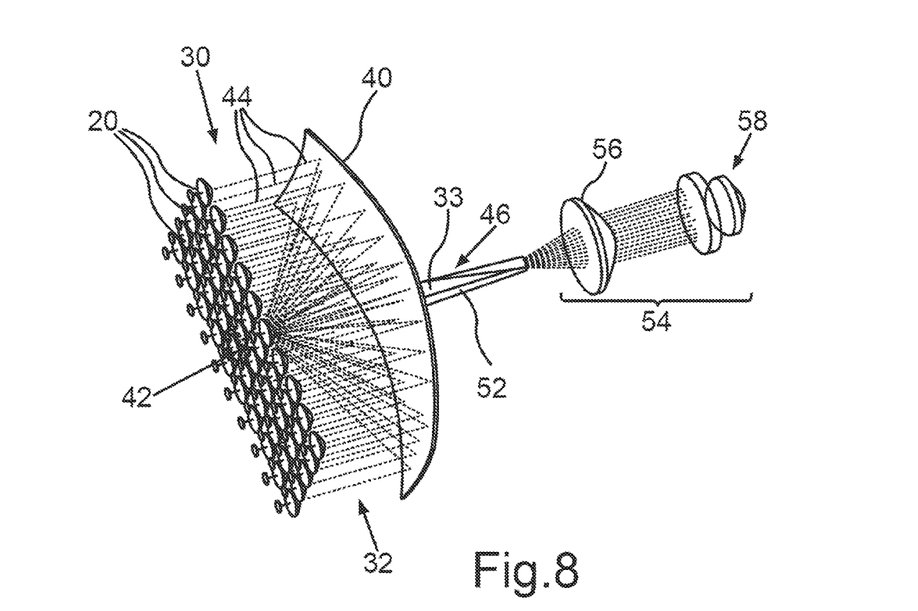
FIG. 8 shows a further embodiment of a headlight/spotlight in accordance with various embodiments on the basis of a light source arrangement in accordance with FIG. 6 in conjunction with an optical waveguide.

FIG. 8 shows a further embodiment of a headlight/spotlight including a light source arrangement based on the light source arrangement 30, as already described above in relation to FIG. 4 to FIG. 7. In contrast to the light source arrangement 30 in accordance with FIG. 4 to FIG. 7, an optical waveguide 52 is arranged in the region of the passage opening in this case, said optical waveguide taking up the beam, which is provided by the deflection unit 32, and guiding it to an imaging system 54. For the sake of clarity, the passage opening is not explicitly drawn in FIG. 8. The imaging system 54 includes a lens arrangement 56, 58, which images the output plane of the optical waveguide 46 on a reflective conversion element that is coated with a phosphor and disposed behind the lens 58 (not explicitly depicted in the drawing). There, the laser light, which in this case has a wavelength in the blue range, is converted into white light and, at the same time, reflected. A dichroic decoupling mirror (not depicted in the drawing for the sake of clarity) is arranged between the lenses 56 and 58 at a 45° angle to the beam path, said mirror transmitting blue laser light and reflecting and therefore decoupling the conversion light which is thus fed to further use.

Figure 11:
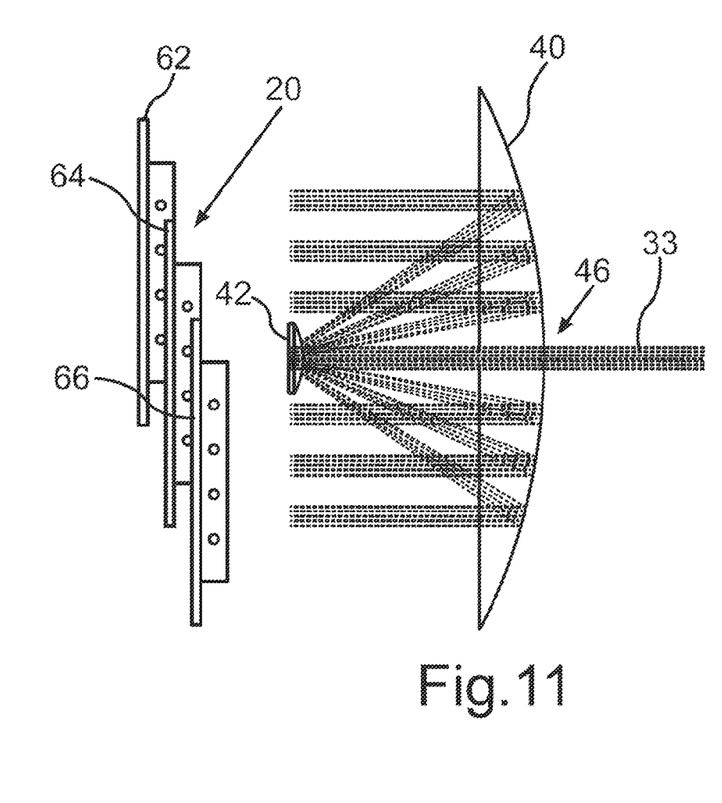
FIG. 11 shows a schematic illustration of a lateral sectional view through a further light source arrangement according to various embodiments on the basis of the embodiment according to FIG. 8
Figure 12:
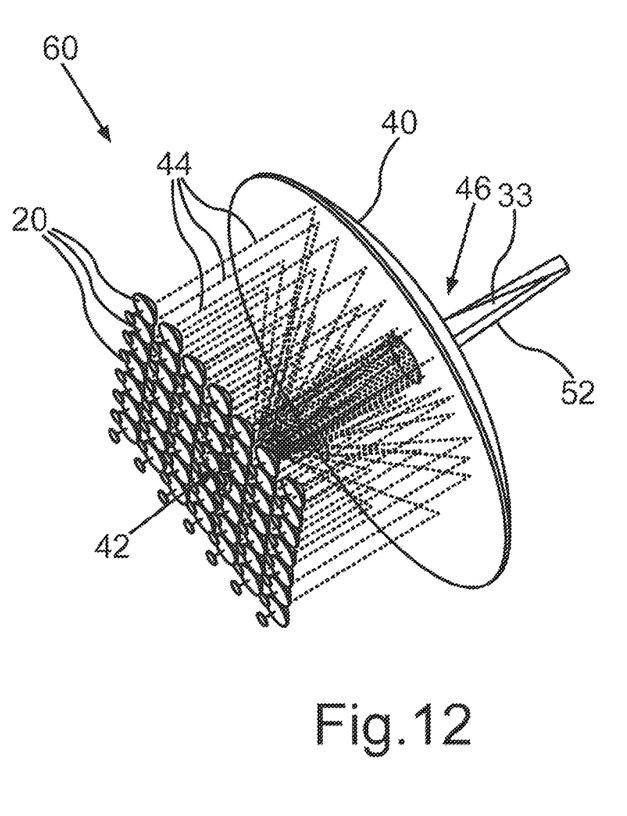
FIG. 12 shows a schematic perspective illustration of the embodiment according to FIG. 11.

FIG. 11 shows a schematic illustration of a lateral sectional view through a further light source arrangement 60 according to various embodiments, which is based on the embodiment according to FIG. 8. FIG. 12 shows the light source arrangement in accordance with FIG. 11 in a schematic perspective illustration. In contrast to the embodiment according to FIG. 8, provision is made in this case for a circular spherical first mirror element 40. It serves to capture and reflect the beam paths 44 from the semiconductor laser light sources 20 which, in this embodiment, are arranged in a number of spacing planes 62, 64, 66 in relation to the first mirror element 40. The further setup substantially corresponds to the setup as was already explained in relation to FIG. 8, which is why reference is made to these explanations in a complementary manner.

Figure 9:
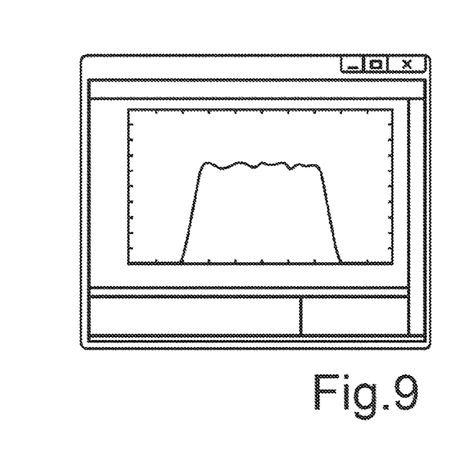
FIG. 9 shows a schematic illustration of a diagram for an intensity distribution over the cross section of the optical waveguide in accordance with FIG. 8.
Figure 10:
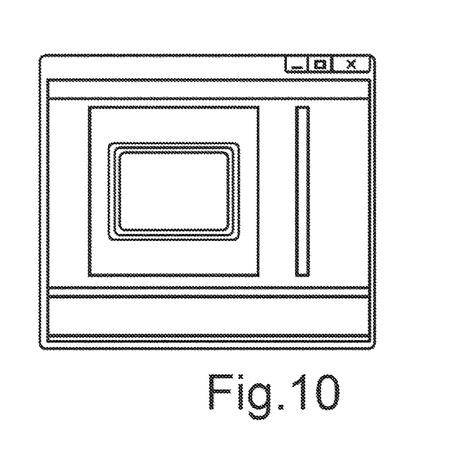
FIG. 10 shows an alternative illustration of the intensity distribution in the optical waveguide on the basis of FIG. 9, wherein the illustration in FIG. 10 represents the cross-sectional area and the regions with different shading represent different intensities.

FIG. 9 shows a schematic diagram view of a horizontal intensity profile of the laser light guided through the optical waveguide 52 on the surface of the conversion element. In the present case, the optical waveguide 52 is provided with a rectangular cross section which is aligned in accordance with the arrangement of the semiconductor laser light sources 20. What emerges is the intensity profile, depicted in FIG. 9 using the graph, of the laser excitation radiation on the surface of the conversion element. FIG. 10 shows the intensity distribution over the rectangular cross-sectional area of the conversion element corresponding thereto. In this case, the inner area of the rectangular region has a homogeneity of greater than 85%.

Therefore what should be noted overall is that the deflection unit 32 of various embodiments has a first mirror element 40, also referred to as primary mirror, which can have a concave parabolic embodiment. This first mirror element 40 may be combined with the second mirror element 42, also referred to as secondary mirror, which may have a convex hyperbolic embodiment. As a result of this, very good imaging properties, a small focus of the mirror system and advantages for the subsequent optical system 22 emerge.

In a further embodiment, provision may be made for the first mirror element 40 to have a concave parabolic embodiment, whereas the second mirror element 42 has a convex spherical embodiment. Although this embodiment has less expedient imaging properties, it is for this reason more cost-effective to produce, for example in conjunction with a plano-convex lens with a mirror coating or the like.

Furthermore, beam shaping or homogenizing elements may be provided, e.g. in the form of a rectangular optical waveguide 52, by which setting a rectangular spot becomes achievable. The optical waveguide entry opening may also be arranged within the deflection unit 32, as a result of which a shorter installation length of the overall system may emerge.

Furthermore, a plurality of higher powered laser light sources with a collimated output radiation field can be provided, for example in the form of a so-called "multi-die package", which can have powers of up to 50 W output power. Using such an embodiment, overall optical powers of several 100 W can be realized. A multi-die package is a highly concentrated integrated arrangement of laser diodes which are arranged in a matrix shape, e.g. 40 laser diodes in a 5×8 matrix or a matrix arrangement of 16×9 that is matched to a 16:9 image format, i.e. 144 laser diodes. By way of example, each laser diode 20 depicted in FIG. 8 can be replaced by an above-described multi-die package.

Further embodiments emerge from using catadioptric systems, wherein, for example, the two mirror elements may be embodied as rear face mirrors and hence the actual mirror substrate can be used in a complementary manner as a lens for the compensation of aberrations.

A further embodiment provides for the first mirror element to be embodied as a faceted mirror element or as a free-form mirror. As a result of this, there are further design options for the optical system.

As already mentioned at the outset, use can be made of semiconductor laser light sources 20 with different wavelengths, e.g. different wavelengths in the range from blue to ultraviolet (UV) to infrared (IR), or else wavelengths which can replace regions of a phosphor conversion, e.g. red.

Finally, provision may be made for the first mirror element 40 to be able to include beam shaping elements such as e.g. optical waveguides, diffusers, micro-lens arrays, lenses or the like, which may be a constituent of the mirror substrate and hence may have a monolithic embodiment.

The embodiments explained above merely serve to explain various embodiments and do not restrict them. Various embodiments can be used not only in headlights for motor vehicles, but also, in general, in illuminants for video and data projectors, e.g. at high and very high light powers.

Here, the laser light sources need not be aligned in a strict matrix arrangement but can be arranged freely in accordance with the requirements.

The laser light sources can also emit different wavelengths.

Also, the orientation of the beam profiles of the semiconductor lasers, i.e., specifically, the orientation of the fast axis, need not be aligned uniformly but can be designed freely in accordance with the requirements. In this manner, it is possible to generate beam profile patterns which then subsequently likewise generate different intensity distributions, adapted to the specific illumination object, on a conversion element. Additionally, the respective semiconductor lasers of a multi-die package can have a respectively different polarization orientation. The laser light sources can be operated individually, in groups or all together in continuous wave operation or else in a clocked or pulsed manner, wherein the clock times of the individual laser light sources or of the laser light sources respectively switched together to form a strand are adjustable in a variable manner, i.e. they can also be different. Additionally, the respective laser light sources of a multi-die package can be operated independently in each case with different operating modes, for example with different clock times and energization values. Specifically, this means that each individual laser diode is actuatable directly and independently of the other laser diodes in the multi-die package. This may allow the energy density distribution of the laser spot on the conversion element to be varied or set in accordance with the requirements.

Finally, features of the claims and the description can naturally be combined with one another in virtually any desired way in order to arrive at further embodiments within the meaning of the invention. By way of example, device features can also be realized by corresponding method steps, and vice versa.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A light source arrangement, comprising:
a plurality of semiconductor laser light sources arranged in such a way that the laser light emitted by the semiconductor laser light sources is aligned in parallel, and
a deflection unit configured to collect and influence all beam paths of the laser light emitted by the semiconductor laser light sources so as to form a beam,
wherein the deflection unit has a first mirror element with a concavely curved surface, which is embodied to capture and reflect the laser light emitted by the semiconductor laser light sources by the surface, and a second mirror element with a convexly curved surface, which is embodied to capture and focus the laser light reflected by the first mirror element,
wherein the first mirror element has a passage opening,
wherein an optical waveguide is arranged in the passage opening, said optical waveguide extending beyond the first mirror element, and
wherein the curvatures and the distance between the surfaces of the first and the second mirror element are embodied in such a way that a focus of the concavely curved surface coincides with a virtual focus of the convexly curved surface.

2. The light source arrangement of claim 1,
wherein the optical waveguide is arranged in the passage opening, said optical waveguide extending beyond the first mirror element on the rear side in relation to the concavely curved surface of the first mirror element.

3. The light source arrangement of claim 1,
wherein the second mirror element is embodied to focus the laser light reflected from the surface thereof into the passage opening.

4. The light source arrangement of claim 1,
wherein the optical waveguide projects beyond the concavely curved surface of the first mirror element in the direction of the second mirror element and the second mirror element is embodied to focus the laser light reflected from the surface thereof onto a coupling surface of the optical waveguide.

5. The light source arrangement of claim 1,
wherein a cross-sectional area of the passage opening is embodied in a manner matched to an arrangement of the semiconductor laser light sources.

6. The light source arrangement of claim 1,
wherein the deflection unit has a lens in the beam path between the semiconductor laser light sources and the first mirror element.

7. The light source arrangement of claim 6,
wherein the lens has an integral embodiment with the second mirror element.

8. The light source arrangement of claim 1,
wherein a distance between the semiconductor laser light sources and the concavely curved surface of the first mirror element is less than a distance between the convexly curved surface of the second mirror element and the concavely curved surface of the first mirror element.

9. A headlight/spotlight, comprising:
a housing having a light exit opening, and
a light source arrangement arranged in the housing,
the light source arrangement comprising:
a plurality of semiconductor laser light sources arranged in such a way that the laser light emitted by the semiconductor laser light sources is aligned in parallel, and
a deflection unit configured to collect and influence all beam paths of the laser light emitted by the semiconductor laser light sources so as to form a beam,
wherein the deflection unit has a first mirror element with a concavely curved surface, which is embodied to capture and reflect the laser light emitted by the semiconductor laser light sources by the surface, and a second mirror element with a convexly curved surface, which is embodied to capture and focus the laser light reflected by the first mirror element, wherein the first mirror element has a passage opening, wherein an optical waveguide is arranged in the passage opening, said optical waveguide extending beyond the first mirror element, and wherein the curvatures and the distance between the surfaces of the first and the second mirror element are embodied in such a way that a focus of the concavely curved surface coincides with a virtual focus of the convexly curved surface.

\* \* \* \* \*